US009496634B2

(12) United States Patent
Ohsawa et al.

(10) Patent No.: US 9,496,634 B2
(45) Date of Patent: Nov. 15, 2016

(54) INTERPOSER, PRINTED BOARD UNIT, AND INFORMATION PROCESSING APPARATUS

(71) Applicant: FUJITSU LIMITED, Kawasaki-shi, Kanagawa (JP)

(72) Inventors: Satoshi Ohsawa, Kawasaki (JP); Yoshihiro Morita, Yokohama (JP); Yasushi Masuda, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 14/865,915

(22) Filed: Sep. 25, 2015

(65) Prior Publication Data

US 2016/0099512 A1 Apr. 7, 2016

(30) Foreign Application Priority Data

Oct. 6, 2014 (JP) ................................ 2014-205633

(51) Int. Cl.
*H01R 12/00* (2006.01)
*H05K 1/00* (2006.01)
*H01R 12/70* (2011.01)

(52) U.S. Cl.
CPC ....... *H01R 12/7076* (2013.01); *H01R 12/7082* (2013.01)

(58) Field of Classification Search
CPC .............. H01R 12/7076; H01R 12/70; H01R 12/7082
USPC .................................................... 439/66, 626
See application file for complete search history.

(56) References Cited

U.S. PATENT DOCUMENTS 7,785,147 B2 * 8/2010 Nakayama ......... G01R 1/07314 439/607.05
2009/0221186 A1 9/2009 Nakayama et al.

FOREIGN PATENT DOCUMENTS

JP 2004-134679 A 4/2004
JP 2007-178196 A 7/2007
JP 2012-151252 A 8/2012

* cited by examiner

*Primary Examiner* — Javaid Nasri
(74) *Attorney, Agent, or Firm* — Squire Patton Boggs (US) LLP

(57) ABSTRACT

An interposer includes a first contact terminal pressed against a first fixed terminal for signal transmission; a pair of second contact terminals pressed against second fixed terminals for any one of power supply and grounding, the pair of second contact terminals being disposed with a gap in a pressing direction in which the pair of second contact terminals are pressed against the second fixed terminals, each of the pair of second contact terminals having a larger sectional area than the first contact terminal in a crossing direction that crosses the pressing direction; and a plurality of spring members arranged between the pair of second contact terminals, the plurality of spring members being electro-conductive, having a lower elasticity than the first contact terminal, and pressing the pair of second contact terminals against the second fixed terminals.

16 Claims, 13 Drawing Sheets

INTERPOSER, PRINTED BOARD UNIT, AND INFORMATION PROCESSING APPARATUS

CROSS-REFERENCE TO RELATED APPLICATION

This application is based upon and claims the benefit of priority of the prior Japanese Patent Application No. 2014-205633, filed on Oct. 6, 2014, the entire contents of which are incorporated herein by reference.

FIELD

The embodiment discussed herein is related to an interposer, a printed board unit, and an information processing apparatus.

BACKGROUND

Electro-conductive contactor units including a signal electro-conductive contactor and a power supply electro-conductive contactor have been provided. The signal electro-conductive contactor is adapted to transmit signals between an electronic component and a printed board by being in contact with a signal electrode of the electronic component and a signal electrode of the printed board. The power supply electro-conductive contactor is adapted to transmit power by being in contact with a power supply electrode of the electronic component and a power supply electrode of the printed board. In each of the signal electro-conductive contactor and the power supply electro-conductive contactor, an elastic member is provided between two needle-like members.

Related techniques are disclosed in, for example, Japanese Laid-open Patent Publication No. 2007-178196.

SUMMARY

According to an aspect of the invention, an interposer includes a first contact terminal pressed against a first fixed terminal for signal transmission; a pair of second contact terminals pressed against second fixed terminals for any one of power supply and grounding, the pair of second contact terminals being disposed with a gap in a pressing direction in which the pair of second contact terminals are pressed against the second fixed terminals, each of the pair of second contact terminals having a larger sectional area than the first contact terminal in a crossing direction that crosses the pressing direction; and a plurality of spring members arranged between the pair of second contact terminals, the plurality of spring members being electro-conductive, having a lower elasticity than the first contact terminal, and pressing the pair of second contact terminals against the second fixed terminals.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In the electro-conductive contactor unit, in order to efficiently supply a larger power-source current to the electronic component, it is desirable to make the power supply electro-conductive contactor larger than the signal electro-conductive contactor, and to press the power supply electro-conductive contactor hard against the power supply electrodes of the electronic component and the printed board. Thus, an elastic force of the elastic member of the power supply electro-conductive contactor is larger than that of the elastic member of the signal electro-conductive contactor. When the elastic member of the signal electro-conductive contractor is simply made larger for the elastic member of the power supply electro-conductive contactor, however, a large difference is caused in the stroke between the signal electro-conductive contactor and the power supply electro-conductive contactor. This makes it difficult to bring, the signal electro-conductive contactor into contact with the signal electrode.

Accordingly, it is desired to provide a technique which allows a pressing force and a stroke of a power-supplying or grounding contact terminal for conducting a large current to be closer to a pressing force and a stroke of a signaling contact terminal.

One embodiment of the technique disclosed by the present application will be described.

Figure 1:
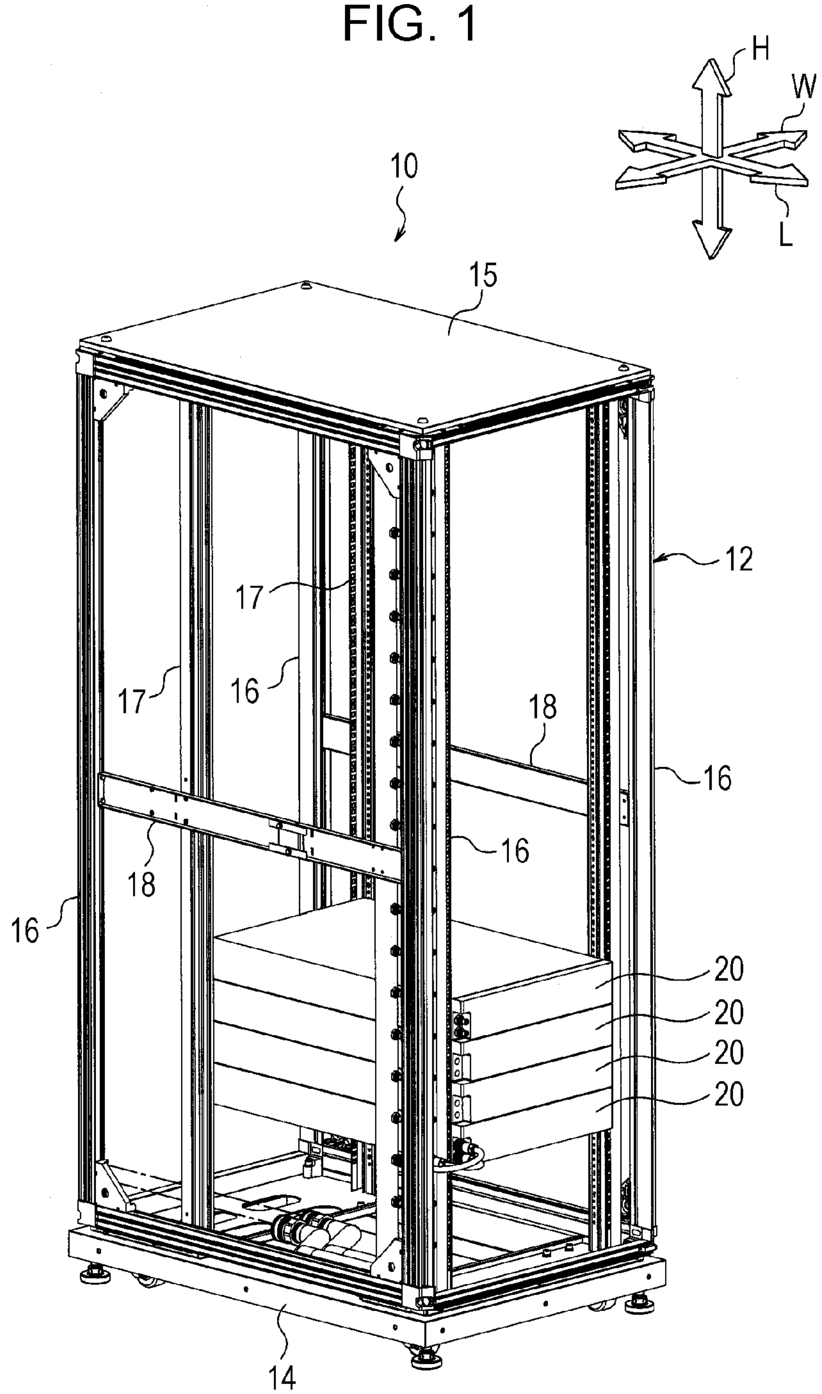
FIG. 1 is a perspective view of an information processing apparatus.

FIG. 1 illustrates an electronic apparatus 10. The electronic apparatus 10 includes a rack 12 and multiple blade-type servers 20, for example. The server 20 is an example of an information processing apparatus.

In FIG. 1, arrow L represents a front-back direction of the electronic apparatus 10, arrow W represents a width direction of the electronic apparatus 10, and arrow H represents a height direction of the electronic apparatus 10. Also, with respect to the rack 12 and the multiple servers 20, the L direction, the W direction, and the H direction represent the front-back direction, the width direction, and the height direction, respectively. In the following description, the front-back direction is referred to as L direction, the width direction is referred to as W direction, and the height direction is referred to as H direction. Note that these directions are for the purpose of illustration and not intended to limit the directions in the actual installation of the electronic apparatus 10. The term of "plan view" when expressed simply refers to a view of the electronic apparatus 10 seen downward from the top in the H direction. Also, the H direction is an example of the pressing direction. The L direction and the W direction are examples of crossing directions that cross the pressing direction.

The rack 12 is long in the H direction and includes a lower frame 14, an upper plate 15, four pillars 16, a pair of vertical frames 17, and a pair of horizontal frames 18, for example. Stacked in the H direction, the multiple servers 20 are fixed to the pillars 16 and the vertical frames 17 and mounted to the rack 12.

Served

Figure 2:
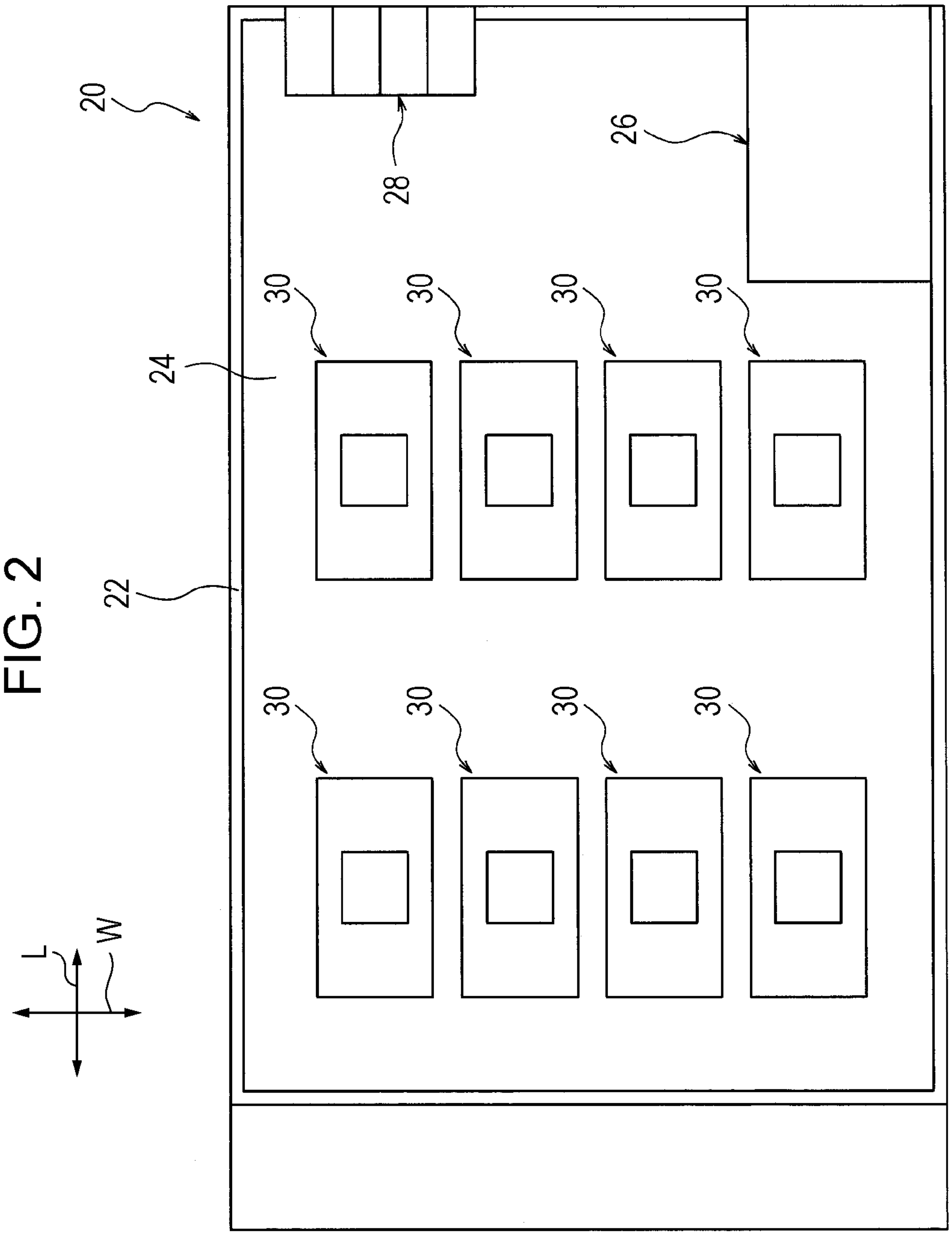
FIG. 2 is an internal view of a server.

As illustrated in FIG. 2, the server 20 includes a case 22 formed in a rectangular frame shape in plan view. Further, the server 20 includes, for example, a main board 24, a power source unit 26, a signal connector 28, and eight printed board units 30. The power source unit 26 is an example of a power supply unit. The signal connector 28 is an example of a signal unit. Furthermore, while the server 20 may include a memory, a hard disc, and a ventilation fan, illustration and description thereof will be omitted.

Multiple wiring patterns are formed on the main board 24. The power source unit 26 is supplied with power from a power source outside the server 20. The signal connector 28 receives input of signals from the outside of the server 20 or another server 20. Further, in the server 20, the signal connector 28 and the printed board units 30 are connected through the wiring patterns, and thereby the printed board units 30 are supplied with signals. Further, the power source unit 26 and the printed board units 30 are connected through the wiring patterns, and thereby the printed board units 30 are supplied with power.

Printed Board Unit

Figure 3:
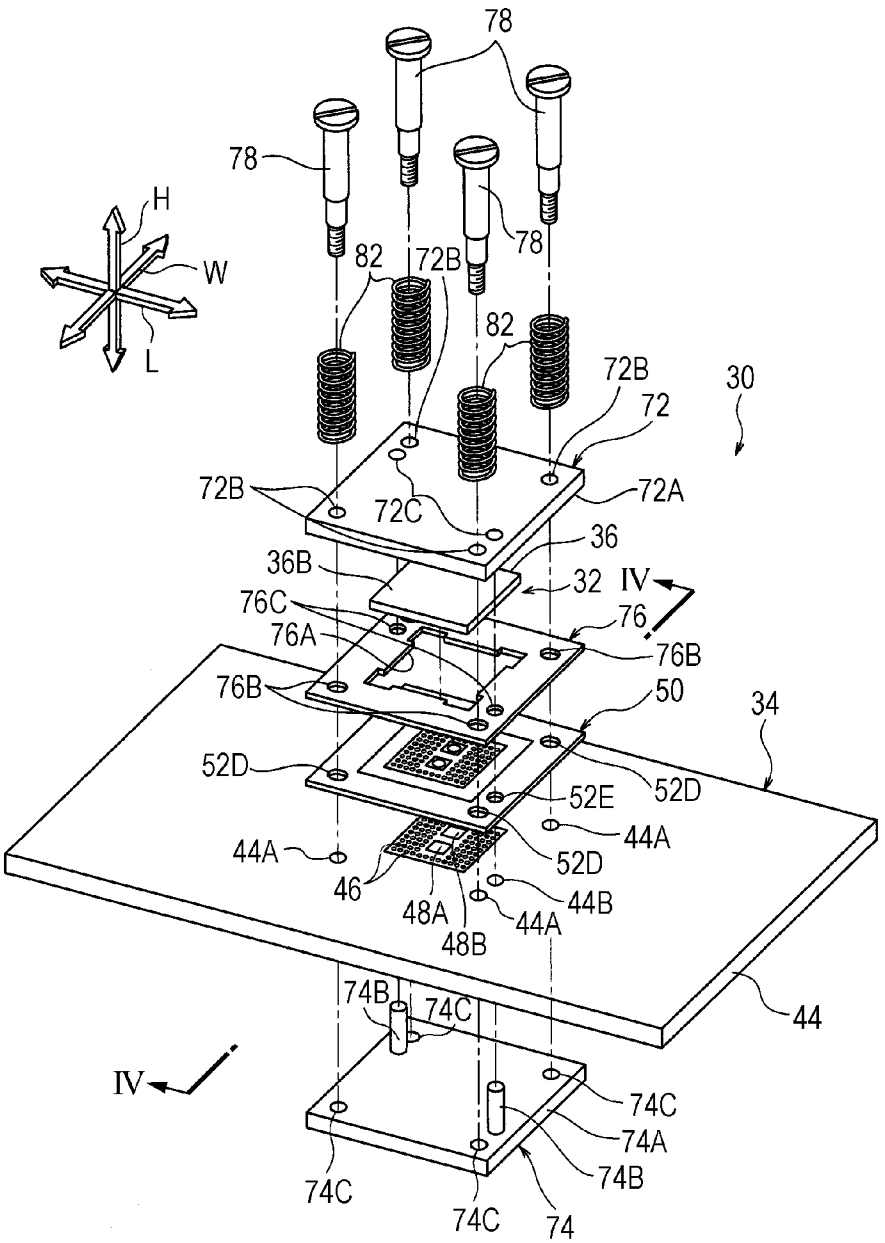
FIG. 3 is an exploded perspective view of a printed board unit.

As illustrated in FIG. 3, the printed board unit 30 includes a package 32 including a large scale integrated circuit (LSI), a system board 34, and an interposer 50, for example. Further, a printed board unit 30 includes a heat sink 72, a stiffener 74, a spacer 76, four screws 78, and four coil springs 82, for example. The heat sink 72 is an example of an attachment member. The spacer 76 is an example of a plate member.

The heat sink 72 is formed in a square plate shape in plan view and has a larger area than the package 32 to cover the package 32. Further, multiple fins are formed on the upper side in the H direction of the heat sink 72. Moreover, when the printed board unit 30 is assembled, a lower face 72A that is the lower side in the H direction of the heat sink 72 comes into contact with an upper face 36B that is the upper side in the H direction of the package 32. In addition, in plan view, the heat sink 72 includes holes 72B formed in four corners and positioning holes 72C each formed adjacent to the holes 72B which are one pair of the holes 72B arranged in diagonal positions.

The holes 72B and the positioning holes 72C penetrate the heat sink 72 in the H direction. Each of the holes 72B has a size through which a screw 78 is able to be inserted. Each of the positioning holes 72C has such a size that the positioning hole 72C may come into contact with a positioning pin 74B when the positioning pin 74B of the stiffener 74 is inserted in the positioning hole 72C.

The stiffener 74 includes, for example, a bottom plate 74A that is square in plan view, two positioning pins 74B erected on the bottom plate 74A, and fastening holes 74C formed in four corners of the bottom plate 74A. The positioning pins 74B are each formed in a column shape whose axial direction is the H direction, and are provided adjacent to the respective fastening holes 74C in one pair of fastening holes 74C arranged in diagonal positions. The internal wall of the fastening hole 74C is provided with internal threads to which external threads of the screw 78 are to be fastened.

The spacer 76 is formed in a square plate shape in plan view, for example. Further, the spacer 76 includes an opening 76A formed at the center and holes 76B formed in four corners in plan view. Moreover, the spacer 76 includes positioning holes 76C formed adjacent to the respective holes 76B in one pair of the holes 76B arranged in diagonal positions.

The opening 76A, the holes 76B, and the positioning holes 76C penetrate the spacer 76 in the H direction. The opening 76A has such a size that the package 32 is able to be accommodated therein. Each of the holes 76B has such a size that the screw 78 is able to be inserted through the hole 76B. Each of the positioning holes 76C has such a size that the positioning pin 74B of the stiffener 74 is able to be inserted in the positioning hole 76C and come into contact with the positioning hole 76C.

The internal diameter of a coil spring 82 is larger than the external diameter of the screw 78. Further, the external diameter of the coil spring 82 is larger than the internal diameter of the hole 72B. Moreover, the screw 78 is inserted in the coil spring 82 in the H direction, and the coil spring 82 is held between the head of the screw 78 and the heat sink 72 to apply an external force to the heat sink 72 downward in the H direction.

Package

Figure 4:
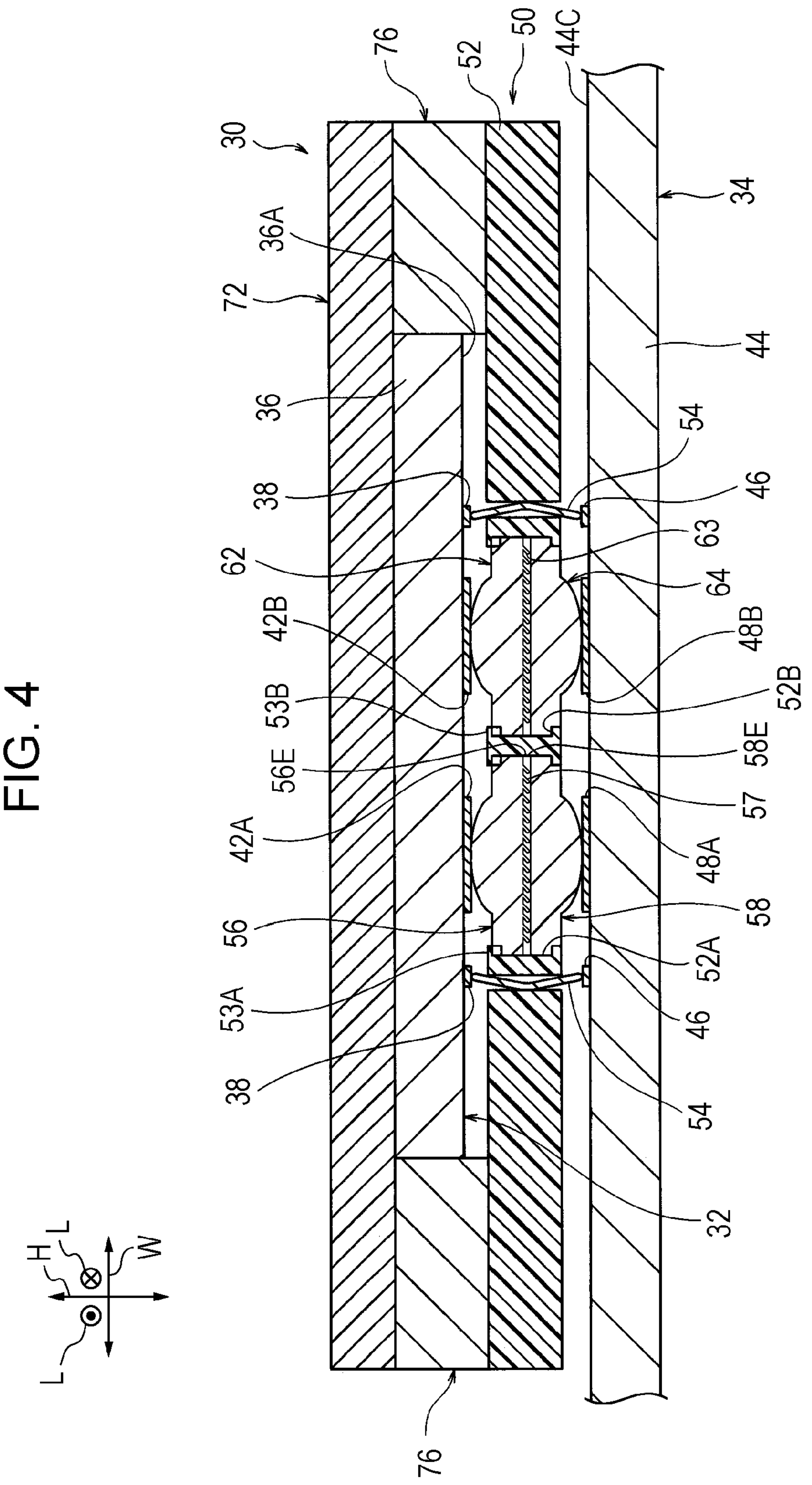
FIG. 4 is a vertical sectional view (cross section taken along line IV-IV of FIG. 3) of the printed board unit.

As illustrated in FIG. 4, the package 32 includes a package substrate 36, multiple first pads 38, second pads 42A and 42B, and multiple electronic components, for example. Further, the package 32 is a semiconductor package that serves as a central processing unit (CPU) of the server 20 (see FIG. 2), for example. The package substrate 36 is an example of a first circuit board. The first pad 38 is an example of a first fixed terminal for signal transmission. The second pad 42A is an example of a second fixed terminal for power supply (for power source). The second pad 42B is an example of a second fixed terminal for grounding.

The package substrate 36 is formed in a plate shape whose thickness direction is the H direction. The multiple first pads 38 spaced in the W direction and the L direction are formed on a lower face 36A that is the lower side in the H direction of the package substrate 36, for example. Further, the second pads 42A and 42B spaced in the W direction are formed on the lower face 36A, for example. Moreover, circuit patterns that electrically connect the multiple first pads 38, the second pads 42A and 42B, and multiple other electronic components to each other are formed on the package substrate 36.

System Board

As illustrated in FIG. 4, the system board 34 includes a substrate 44, multiple first pads 46, second pads 48A and 48B, and multiple electronic components, for example. The substrate 44 is an example of a second circuit board. The first pad 46 is an example of a first fixed terminal for signal transmission. The second pad 48A is an example of a second fixed terminal for power supply. The second pad 48B is an example of a second fixed terminal for grounding.

As illustrated in FIG. 3, the substrate 44 is formed in a plate shape whose thickness direction is the H direction, for example. Further, the substrate 44 is wider in the W direction and the L direction than the interposer 50. Moreover, in the substrate 44, four through holes 44A and two positioning holes 44B are formed. Note that, in FIG. 3, illustration of one of the through holes 44A and one of the positioning holes 44B is omitted.

The four through holes 44A penetrate the substrate 44 in the H direction. Further, each of the four through holes 44A is formed in a corresponding corner of a square surrounding the multiple first pads 46 and the second pads 48A and 48B in plan view. Each of the two positioning holes 44B is formed between a corresponding pair of the through holes 44 arranged in the W direction. Note that, in FIG. 3, illustrations of one of the through holes 44A and one of the positioning holes 44B which are located in the backside in the W direction are omitted.

As illustrated in FIG. 4, the multiple first pads 46 spaced in the W direction and the L direction are formed on an upper face 44C that is the upper side in the H direction of the substrate 44, for example. Further, the second pads 48A and 48B spaced in the W direction are formed on the upper face 44C, for example. Moreover, circuit patterns that electrically connect the multiple first pads 46, the second pads 48A and 48B, and multiple other electronic components to each other are formed on the substrate 44.

The first pad 46 is arranged so as to partially overlap with the first pad 38 in plan view. Further, the second pad 48A is arranged so as to partially overlap with the second pad 42A in plan view, and the second pad 48B is arranged so as to partially overlap with the second pad 42B in plan view.

Interposer

Next, the interposer 50 will be described.

As illustrated in FIG. 4, the interposer 50 includes a housing 52, multiple signal contacts 54, power source contacts 56 and 58, ground contacts 62 and 64, multiple elastic members 57, and multiple elastic members 63. The housing 52 is an example of a substrate. The signal contact 54 is an example of a first contact terminal. The power source contacts 56 and 58 and the ground contacts 62 and 64 are an example of a second contact terminal. The elastic members 57 and 63 have electro-conductivity and are an example of a spring member. The number of signal contacts 54 (pins) is 80, for example.

Housing

Figure 5:
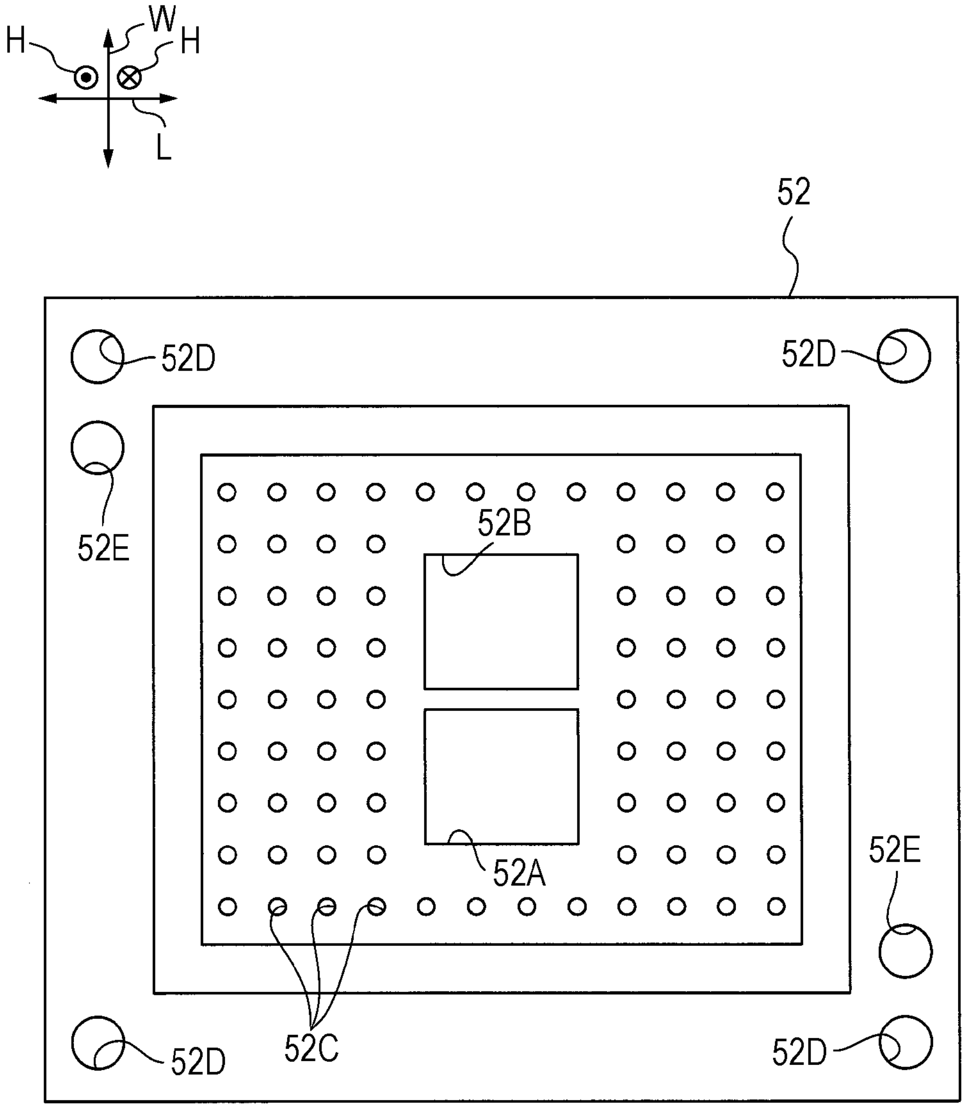
FIG. 5 is a plan view of a substrate of an interposer.

As illustrated in FIG. 5, the housing 52 is formed in a plate shape extending in the L direction and the W direction in a square shape and having a thickness in the H direction, for example. Further, the housing 52 is formed of an insulator (epoxy resin, for example). Moreover, in plan view of the housing 52, a first through opening 52A and a second through opening 52B are formed in the center of the housing 52. In addition, multiple third through holes 52C are formed around the first through opening 52A and the second through opening 52B in the housing 52. Note that the first through opening 52A and the second through opening 52B are an example of a through opening.

Further, fourth through holes 52D are formed in four corners of the housing 52, respectively, in plan view of the housing 52. Moreover, in the housing 52, positioning holes 52E are each formed adjacent to the fourth through holes 52D which are one pair of the fourth through holes 52D arranged in diagonal positions.

The first through opening 52A is formed in a square in plan view of the housing 52 and penetrates the housing 52 in the H direction, for example. Further, the first through opening 52A has a size that may accommodate the power source contacts 56 and 58 (see FIG. 4).

The second through opening 52B is formed in a square in plan view of the housing 52 and penetrates the housing 52 in the H direction, for example. Further, the second through opening 52B has a size that may accommodate the ground contacts 62 and 64 (see FIG. 4).

The third through holes 52C are each formed in a circle in plan view of the housing 52 and penetrate the housing 52 in the H direction, for example. Further, the third through holes 52C each have such a size that the signal contact 54 (see FIG. 4) is accommodated and is deformable in the H direction in the third through hole 52C. The signal contacts 54 are individually inserted in the multiple third through holes 52C one by one. Moreover, while a flange part for restricting detachment of the signal contact 54 is provided to the third through hole 52C, illustration and description thereof will be omitted.

The fourth through holes 52D penetrate the housing 52 in the H direction. Further, the fourth through holes 52D each have such a size that the screw 78 (see FIG. 3) is able to be inserted.

The positioning holes 52E penetrate the housing 52 in the H direction. Further, the positioning holes 52E each have such a size that the positioning pin 74B of the stiffener 74 is able to be inserted therein and the positioning hole 52E may come into contact with the positioning pin 74B.

Figure 6:
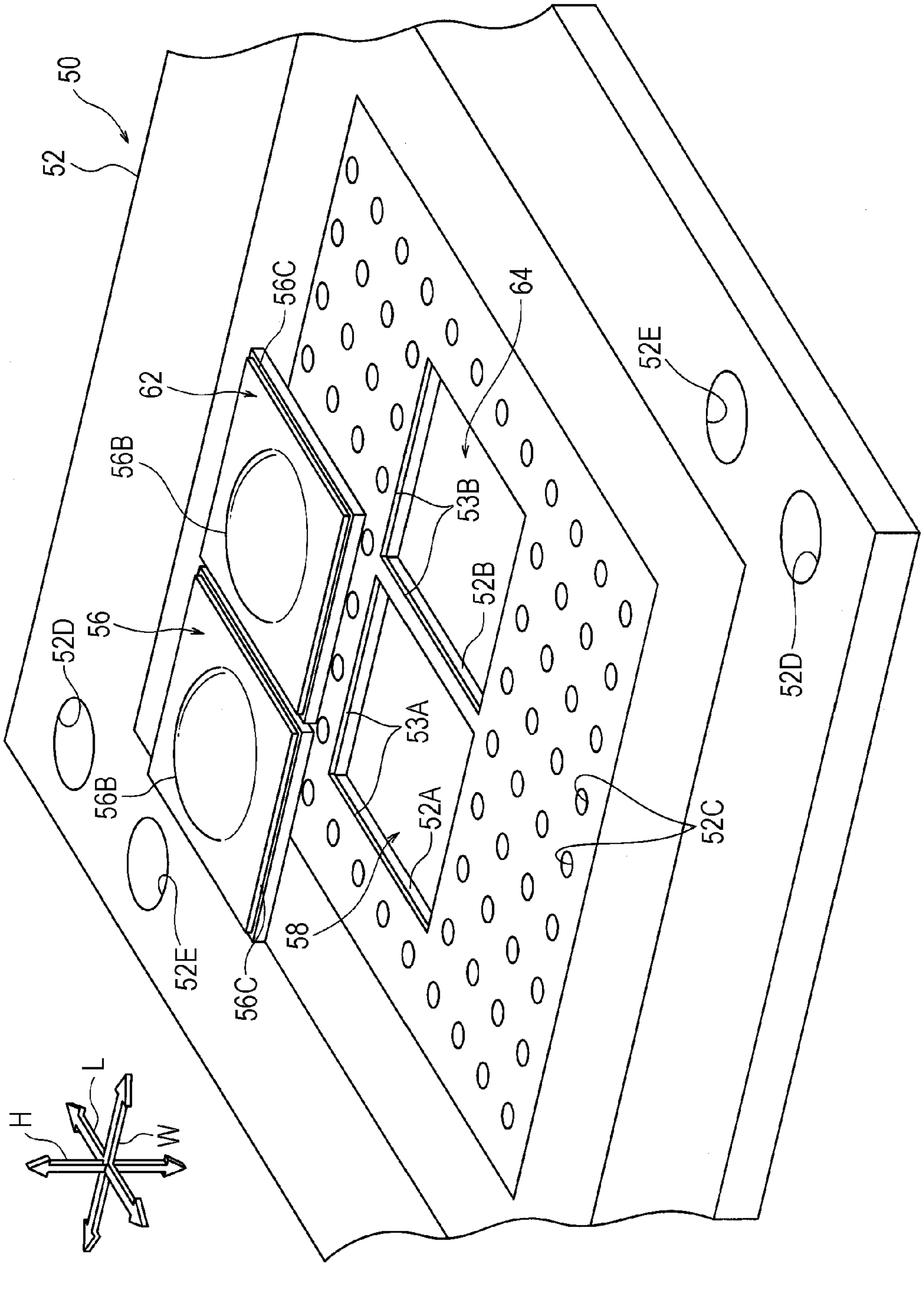
FIG. 6 is an exploded perspective view of the substrate of the interposer.

As illustrated in FIG. 6, a flange part 53A protruding inward the first through opening 52A from each opening edge at the upper end in the H direction of the first through opening 52A is formed to the housing 52, for example. Further, a flange part 53B protruding inward the second through opening 52B from each opening edge at the upper end in the H direction of the second through opening 52B is formed to the housing 52, for example. The flange parts 53A and 53B are an example of a restricting part. Note that, while the flange parts 53A and 53B are formed also at the lower end in the H direction of the housing 52, illustration thereof is omitted in FIG. 6.

Figure 8:
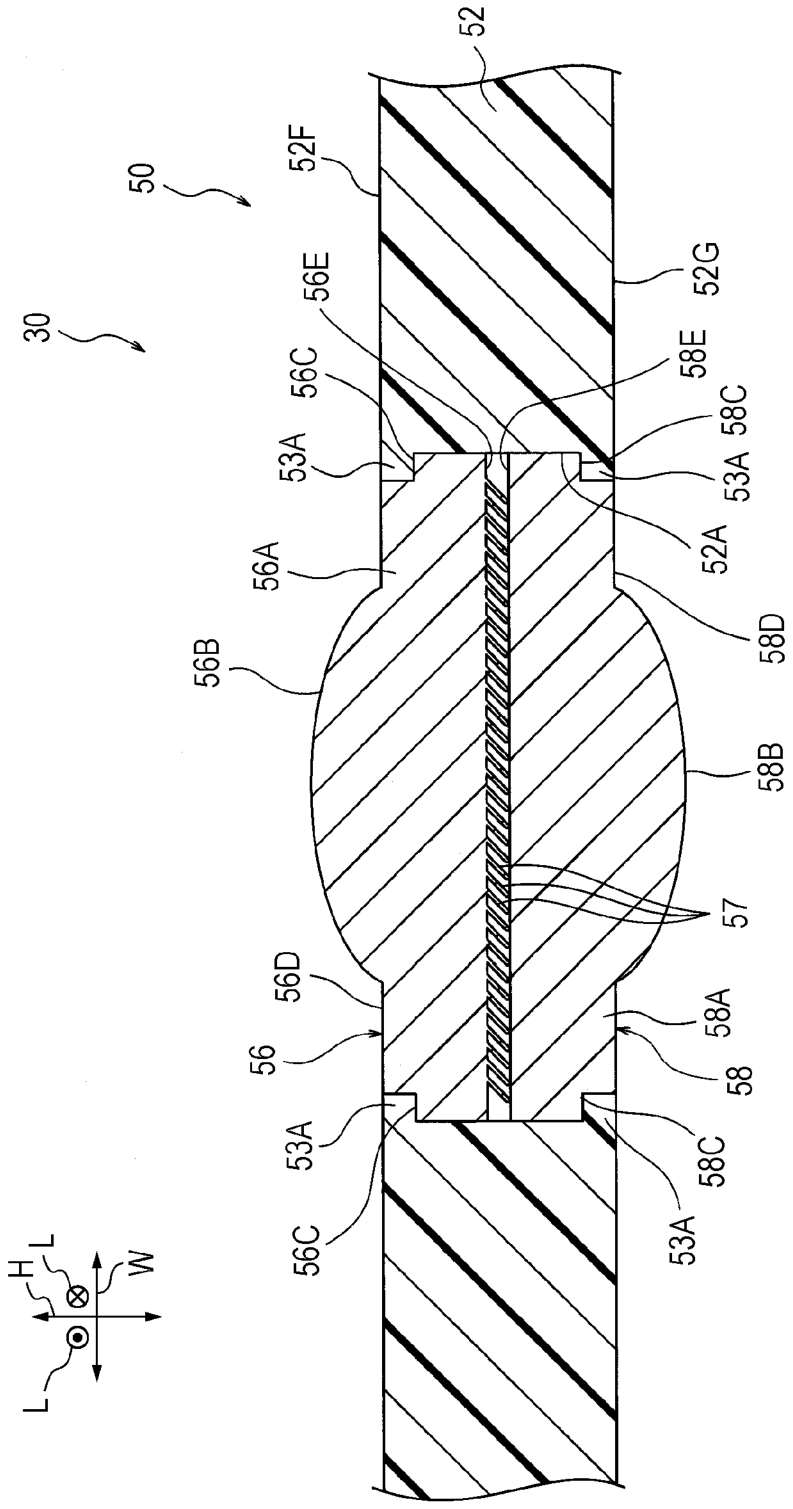
FIG. 8 is a partially-enlarged sectional view of a power source contact of the interposer.
Figure 9:
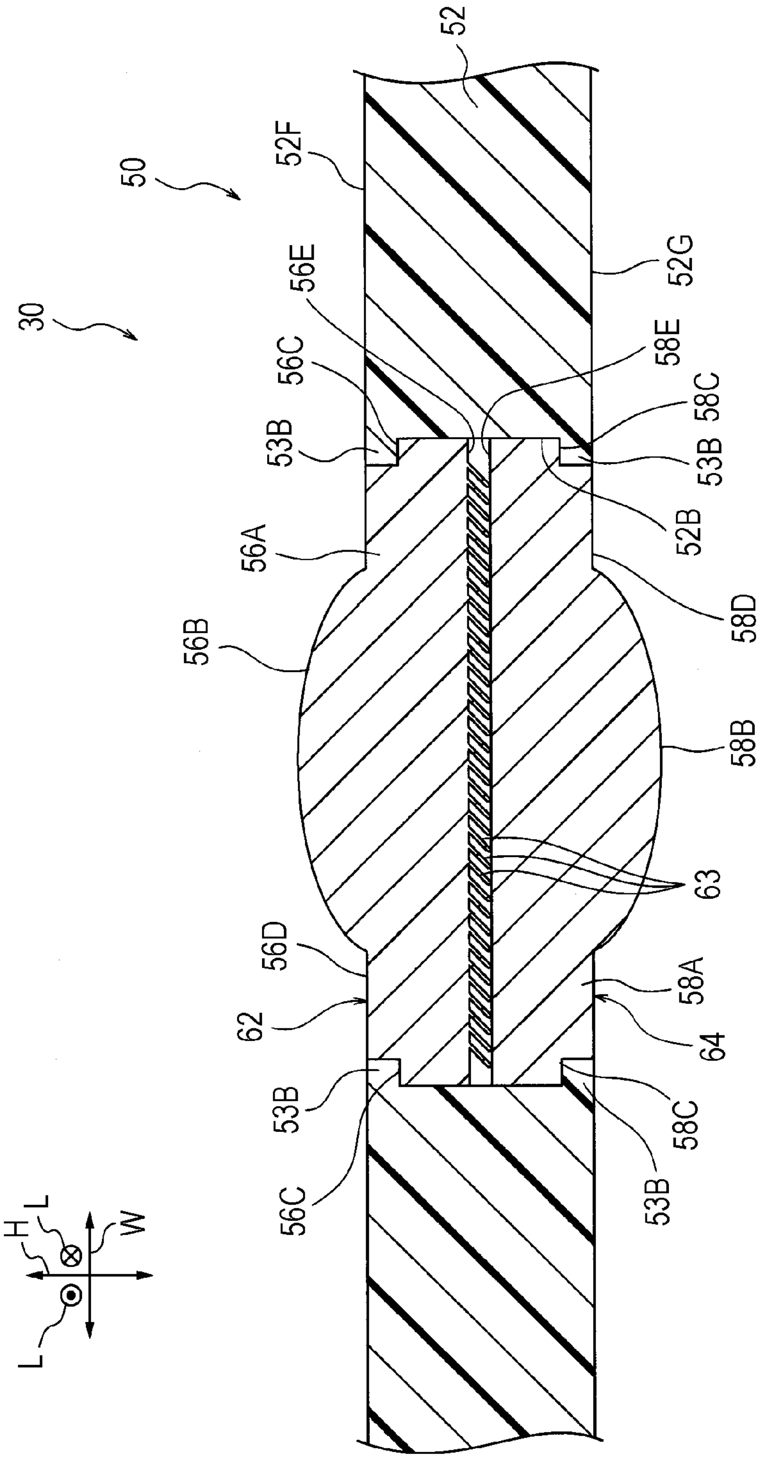
FIG. 9 is a partially-enlarged sectional view of a ground contact of the interposer.

Further, the flange part 53A in the upper side in the H direction has a shape whose cross section has an inverse L-shape and the flange part 53A in the lower side in the H direction has a shape whose cross section has an L-shape, and the flange parts 53A have such a size that the flange parts 53A may respectively come into contact with step parts 56C and 58C described later of the power source contacts 56 and 58 (FIG. 8). The flange part 53B in the upper side in the H direction includes a shape whose cross section includes an inverse L-shape, and the flange part 53B in the lower side in the H direction includes a shape whose cross section includes an L-shape, and the flange parts 53B have such a size that the flange parts 53B may respectively come into contact with step parts 56C and 58C described later of the ground contacts 62 and 64 (FIG. 9).

Note that the housing 52 is formed by stacking two substrates in the H direction and bonding the substrates to each other. The power source contacts 56 and 58 are accommodated in the first through opening 52A, and the ground contacts 62 and 64 are accommodated in the second through opening 52B.

Signal Contact

Figure 7:
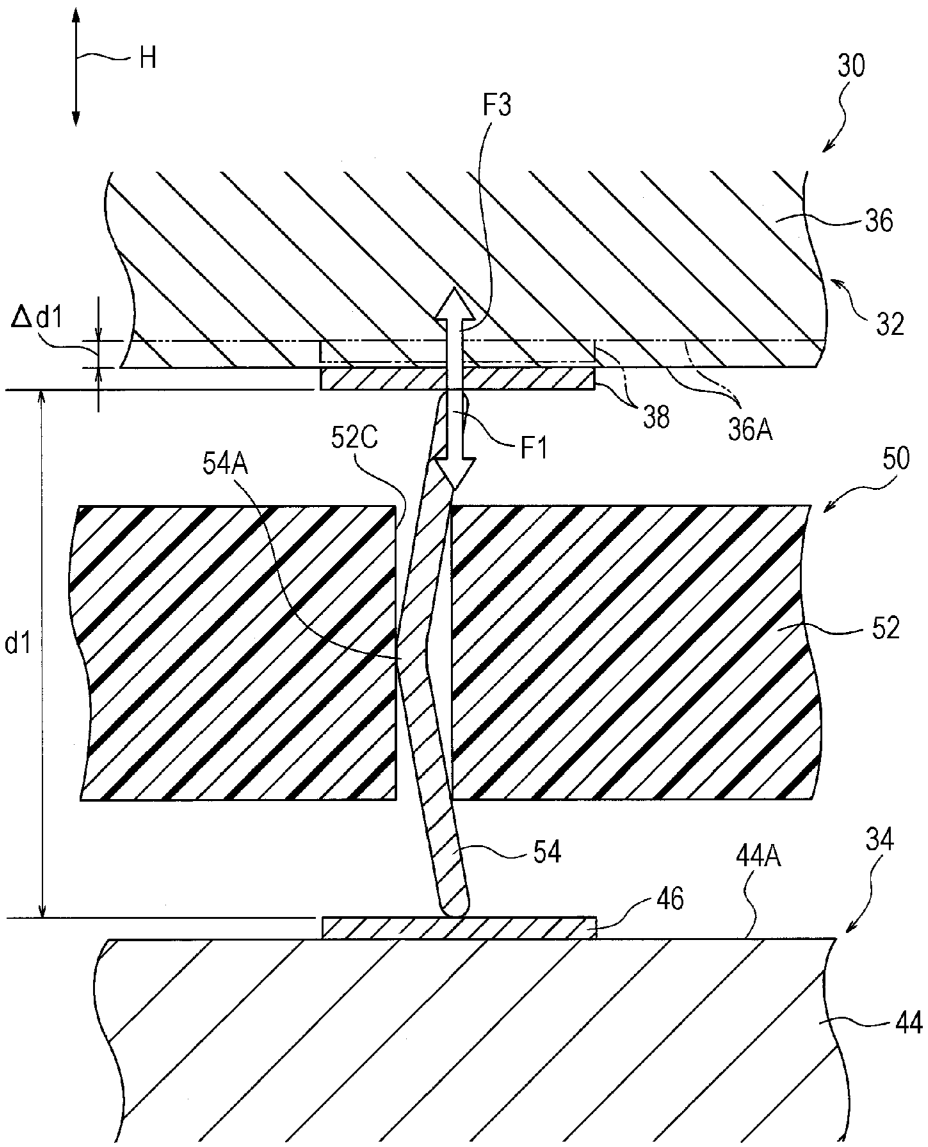
FIG. 7 is a partially-enlarged sectional view of a signal contact.

As illustrated in FIG. 7, the signal contact 54 is, for example, a column-like pin containing copper, having an elasticity that enables the signal contact 54 to deform in the H direction, and is inserted in the third through hole 52C. Each of one end (upper end) and the other end (lower end) in the axial direction of the signal contact 54 is formed in a hemisphere. Further, the signal contact 54 includes a bent part 54A formed at the center in the axial direction, for example. Since the signal contact 54 includes the bent part 54A, one end in the axial direction may shift relative to the other end.

The one end of the signal contact 54 comes into contact with the first pad 38 when the printed board unit 30 is assembled. The other end of the signal contact 54 comes into contact with the first pad 46 when the printed board unit 30 is assembled. Note that the interval between neighboring signal contacts 54 is 0.8 mm, for example. A stroke in the H direction of the signal contact 54 when an external force F1 is applied to the signal contact 54 is here represented as d1. In the present embodiment, the stroke of the signal contact 54 is defined as a distance from the upper face of the first pad 46 to the lower face of the first pad 38, for example.

Power Source Contact

As illustrated in FIG. 8, the power source contact 56 contains copper, and includes a terminal body 56A, a protruding part 56B formed on the terminal body 56A, and multiple elastic members 57 formed on the bottom part of the terminal body 56A, for example. Note that the elastic members 57 will be described later in detail.

The terminal body 56A is square in plan view and formed in a plate shape whose thickness direction is the H direction. The terminal body 56A is provided with a gap in the H direction from a terminal body 58A described later. The terminal body 56A is wider in the W direction than the signal contact 54 (see FIG. 7) and has such a size that the terminal body 56A is accommodated in the first through opening 52A so as to be able to shift in the H direction. That is, the sectional area (W-L cross section) of the terminal body 56A is larger than the sectional area (W-L cross section) of the signal contact 54. Moreover, the terminal body 56A includes the step part 56C notched in an L-shape in the cross section at the end (edge) in the W direction and the L direction.

The step part 56C has such a size that the step part 56C may come into contact with the flange part 53A in the upper side to restrict an upward shift (movement) in the H direction of the terminal body 56A. Further, the step part 56C has such a height in the H direction that, with the flange part 53A in the upper side and the step part 56C contacting with each other, the height of an upper face 52F of the flange part 53A (the housing 52) matches the height of an upper face 56D of the terminal body 56A, for example. Note that, before the external force is applied to the power source contact 56 from the interposer 50, the flange part 53A and the step part 56C come into contact with each other, for example.

The protruding part 56B protrudes upward in the H direction from the upper face 56D of the terminal body 56A to the second pad 42A (see FIG. 4). Further, the protruding part 56B includes a cross section curved upward in the H direction in a convex manner. The curvature of the W-H cross section of the protruding part 56B is smaller in the center than in the end in the W direction. Moreover, the protruding part 56B is arranged in the center of the terminal body 56A in plan view. Note that the contact area between the protruding part 56B and the second pad 42A in a contact state is 150 times the contact area between the signal contact 54 (see FIG. 7) and the first pad 38 (see FIG. 7) in a contact state, for example.

As illustrated in FIG. 8, the power source contact 58 contains copper and includes a terminal body 58A and a protruding part 58B formed on the terminal body 58A, for example.

The terminal body 58A is square in plan view and formed in a plate shape whose thickness direction is the H direction. The width of the terminal body 58A is wider than the width in the W direction of the signal contact 54 (see FIG. 7) and the terminal body 58A has such a size that the terminal body 58A is accommodated in the first through opening 52A so as to be able to shift in the H direction in the first through opening 52A. That is, the sectional area (W-L cross section) of the terminal body 58A is larger than the sectional area (W-L cross section) of the signal contact 54. Moreover, the terminal body 58A includes the step part 58C notched in an L-shape in the cross section at the end (edge) in the W direction and the L direction. The step part 58C has such a size that the step part 58C may come into contact with the flange part 53A in the lower side to restrict a downward shift (movement) in the H direction of the terminal body 58A.

The protruding part 58B protrudes downward in the H direction from the lower face 58D of the terminal body 58A to the second pad 48A (see FIG. 4). Further, the protruding part 58B includes a cross section curved downward in the H direction in a convex manner, for example. The curvature of the W-H cross section of the protruding part 58B is smaller in the center than in the end in the W direction. Moreover, the protruding part 58B is arranged in the center of the terminal body 58A in plan view. Note that the contact area between the protruding part 58B and the second pad 48A in a contact state is 150 times the contact area between the signal contact 54 (see FIG. 7) and the first pad 46 (see FIG. 7) in a contact state, for example.

The protruding part 56B comes into contact with the second pad 42A (see FIG. 4) when the printed board unit 30 (see FIG. 4) is assembled. The protruding part 58B comes into contact with the second pad 48A (see FIG. 4) when the printed board unit 30 is assembled.

Figure 11:
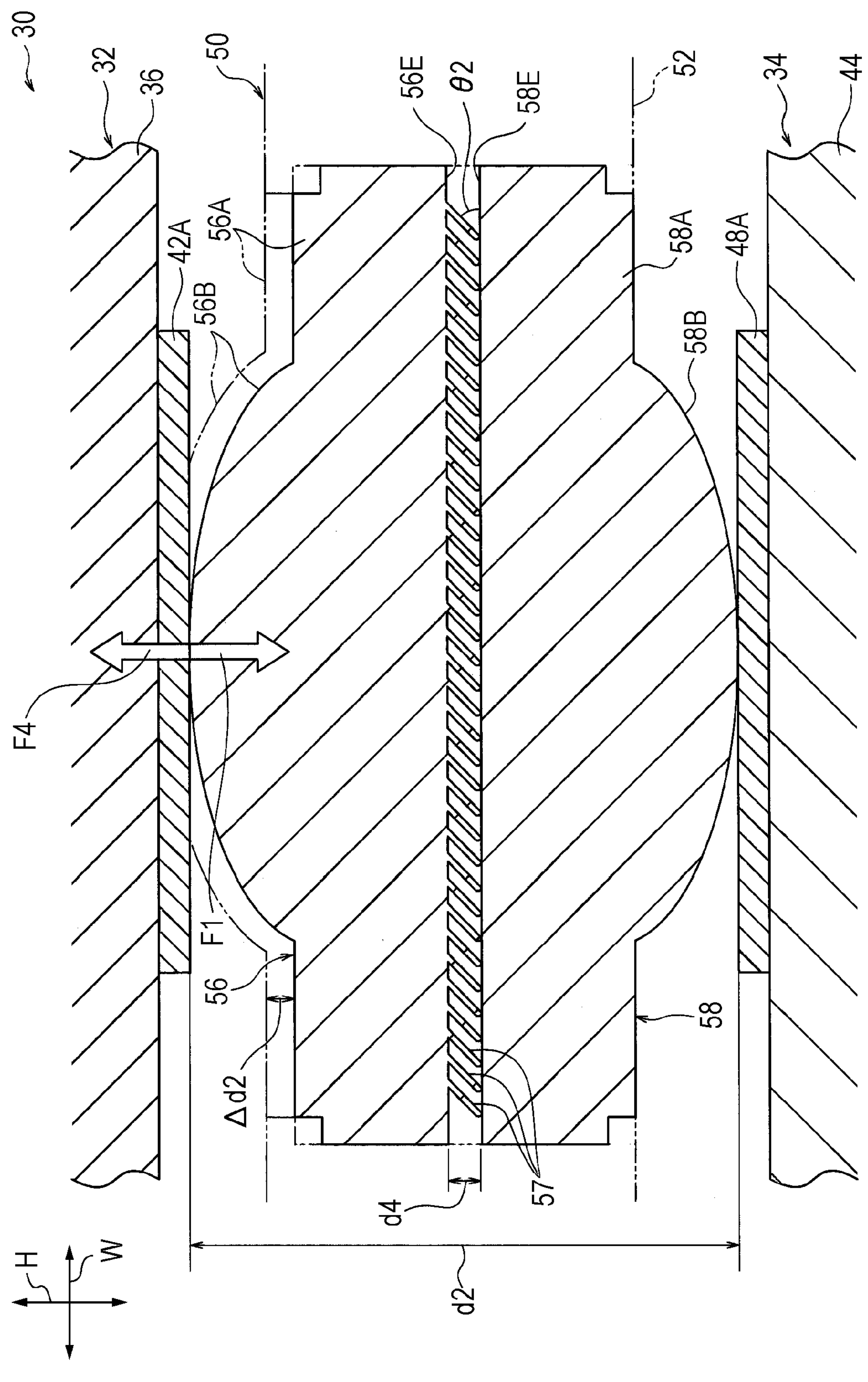
FIG. 11 is a partially-enlarged sectional view of the power source contact.

As illustrated in FIG. 11, a stroke in the H direction of the power source contacts 56 and 58 when the external force F1 is applied to the power source contact 56 is represented as d2. In the present embodiment, the stroke of the power source contacts 56 and 58 is defined as a distance from the upper face of the second pad 48A to the lower face of the second pad 42A.

Ground Contact

As illustrated in FIG. 4, in the present embodiment, the power source contact 56 and the ground contact 62 are formed in a similar manner, and the power source contact 58 and the ground contact 64 are formed in a similar manner, for example. Thus, with respect to the ground contacts 62 and 64, parts similar to those in the power source contacts 56 and 58 are provided with the same reference numbers as those in the power source contacts 56 and 58 and description thereof will be omitted.

As illustrated in FIG. 9, the ground contact 62 contains copper and includes a terminal body 56A, a protruding part 56B, and multiple elastic members 63 formed on the bottom part of the terminal body 56A, for example.

The step part 56C has such a size that the step part 56C may come into contact with the flange part 53B in the upper side to restrict an upward shift (movement) in the H direction of the terminal body 56A. Further, the step part 56C has such a height in the H direction that, with the flange part 53B in the upper side and the step part 56C contacting with each other, the height of the upper face 52F of the flange part 53B matches the height of the upper face 56D of the terminal body 56A, for example. Note that the protruding part 56B protrudes upward in the H direction from the upper face 56D toward the second pad 42B (see FIG. 4).

The ground contact 64 contains copper and includes a terminal body 58A and a protruding part 58B formed on the terminal body 58A, for example. The step part 58C has such a size that the step part 58C may come into contact with the flange part 53B in the lower side to restrict a downward shift (movement) in the H direction of the terminal body 58A.

The protruding part 58B protrudes downward in the H direction from the lower face 58D toward the second pad 48B (see FIG. 4).

Here, the protruding part 56B of the ground contact 62 comes into contact with the second pad 42B (see FIG. 4) when the printed board unit 30 (see FIG. 4) is assembled. The protruding part 58B comes into contact with the second pad 48B (see FIG. 4) when the printed board unit 30 is assembled. The stroke in the H direction of the ground contacts 62 and 64 when the external force F1 (see FIG. 11) is applied to the ground contact 62 is d2 (see FIG. 11).

Elastic Member

In the printed board unit 30 illustrated in FIG. 4, the elastic members 57 and the elastic members 63 are of the same arrangement, for example. Accordingly, the elastic members 57 will be described, and description of the elastic members 63 will be omitted.

The number of the elastic members 57 per unit area is greater than the number of the signal contacts 54 (see FIG. 7) per unit area. Further, the elasticity of the elastic member 57 is lower than the elasticity of the signal contact 54. The sectional area in the direction orthogonal to the axis direction of the elastic member 57 is one-fifth the sectional area in the direction orthogonal to the axis direction of the signal contact 54, for example.

Figure 12:
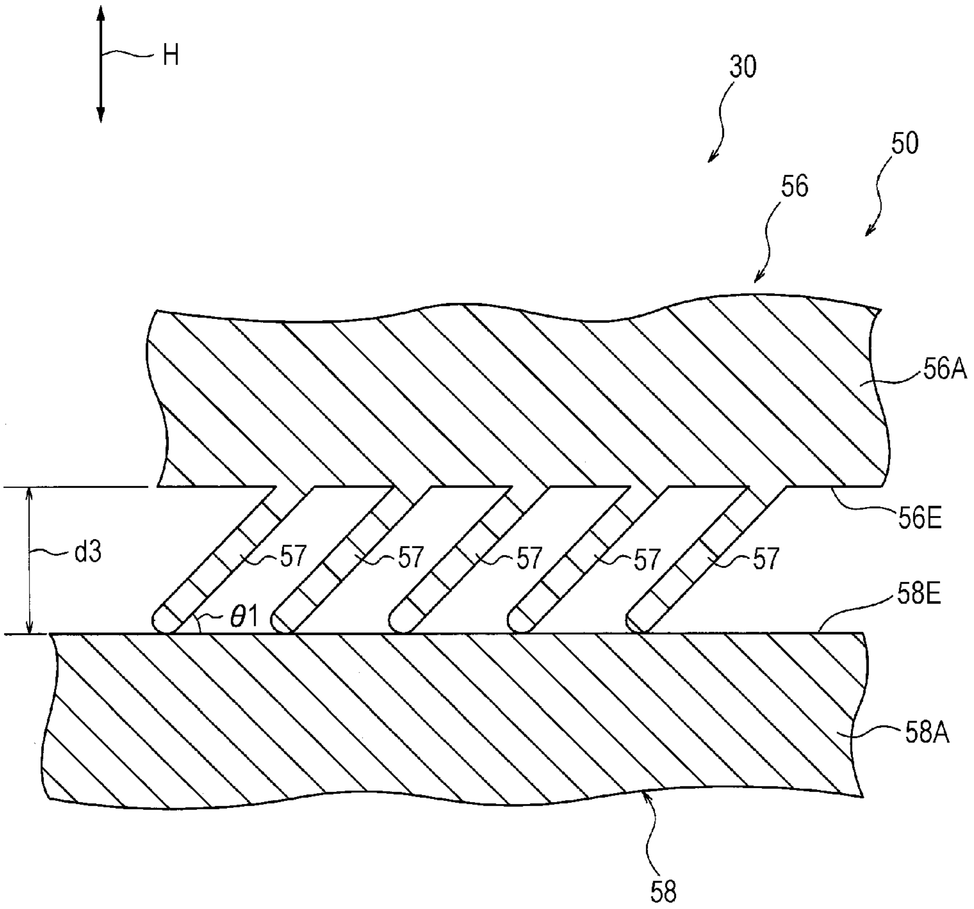
FIG. 12 is a partially-enlarged sectional view illustrating elastic members before deformation.

As illustrated in FIG. 12, each of the multiple elastic members 57 is formed in a column shape on the lower part of the power source contact 56. For example, the multiple elastic members 57 may be obtained by punching using a die. Further, tip ends (lower ends) of the multiple elastic members 57 contact with the power source contact 58. Specifically, each of the multiple elastic members 57 contacts slantwise with an upper face 58E of the power source contact 58, for example. That is, without external force being applied, an axial direction of each of the elastic members 57 forms an angle θ1 with the direction parallel to the upper face 58E. The angle θ1 is an acute angle. Note that the gap in the H direction between a lower face 56E of the power source contact 56 and the upper face 58E of the power source contact 58 in this state is represented as d3. The lower face 56E and the upper face 58E are plane surfaces.

As illustrated in FIG. 11, when the external force F1 given by contraction of the coil springs 82 (see FIG. 3) is applied to the power source contacts 56 and 58, the gap in the H direction between the lower face 56E of the power source contact 56 and the upper face 58E of the power source contact 58 is d4. The gap d4 is smaller than the gap d3 (see FIG. 12). Note that the external force F1 is an example of a set external force preset as a reference.

Further, in a state where the multiple elastic members 57 further incline from the state of the angle θ1 (see FIG. 12) and the gap between the lower face 56E and the upper face 58E is d4, the axial direction of the multiple elastic members 57 forms an angle θ2 with the direction parallel to the upper face 58E. The angle θ2 is smaller than the angle θ1 (see FIG. 12). The difference between the gap d3 and the gap d4 here corresponds to a shift distance Δd2 of the power source contact 56 when the external force F1 is applied. That is, Δd2=d3−d4.

In the present embodiment, as an example of the shift (relative movement) of the power source contacts 56 and 58 with respect to the housing 52, illustration and description will be provided for the case where the power source contact 56 shifts by the shift distance Δd2 while the power source contact 58 does not shift. The gap between the housing 52 and the substrate 44 may be maintained by using a washer. Note that the power source contact 58 alone may shift or both of the power source contacts 56 and 58 may shift. The same applies to the ground contacts 62 and 64 (see FIG. 4).

Figure 13:
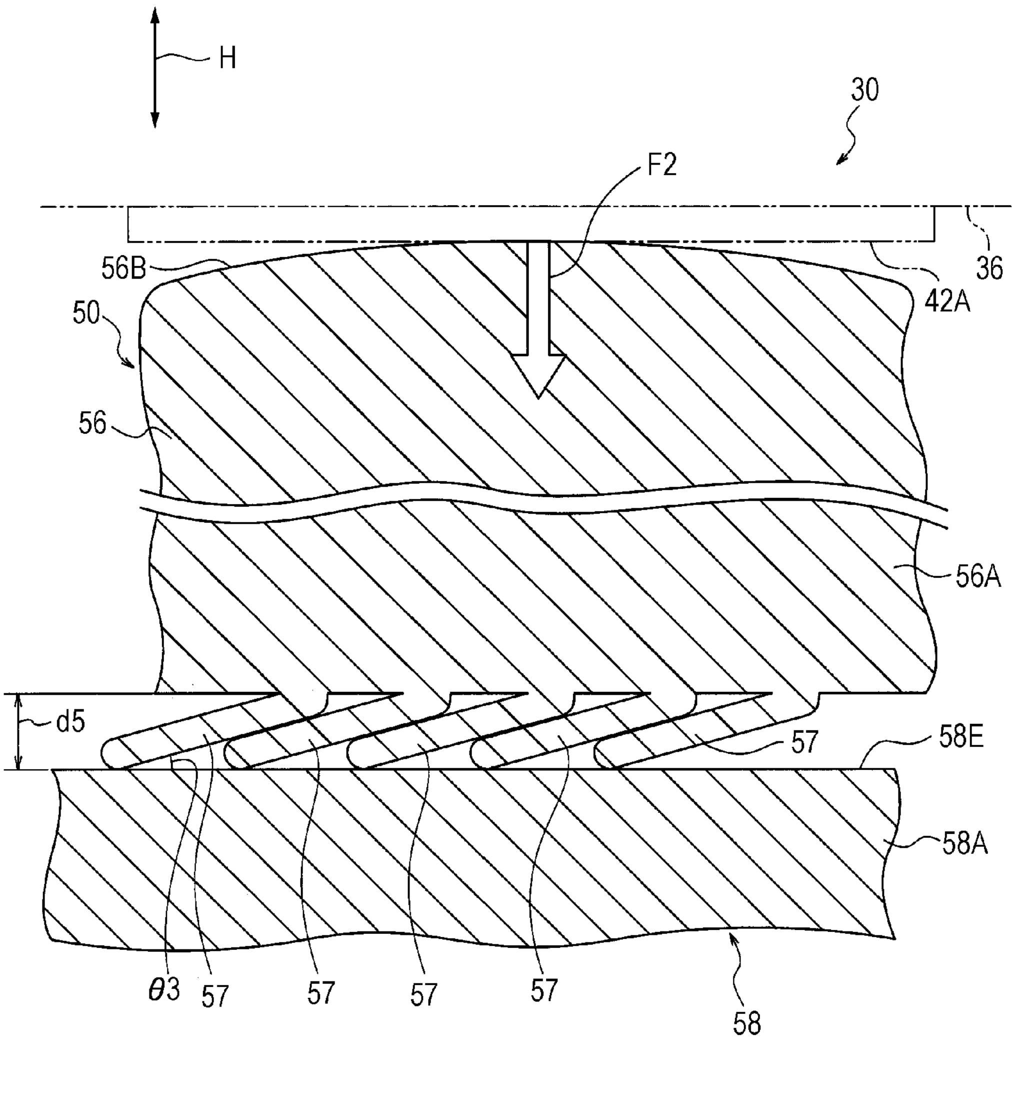
FIG. 13 is a partially-enlarged sectional view illustrating the elastic members after deformation.

As illustrated in FIG. 13, when an external force F2 that is larger than the external force F1 (see FIG. 11) is applied to the power source contacts 56 and 58, the gap in the H direction between the lower face 56E of the power source contact 56 and the upper face 58E of the power source contact 58 becomes d5. The gap d5 is smaller than the gap d4 (see FIG. 11). Further, in a state where the gap between the lower face 56E and the upper face 58E is d5, the axial direction of the multiple elastic members 57 forms an angle θ3 with the direction parallel to the upper face 58E. The angle θ3 is smaller than the angle θ2 (see FIG. 11). Further, the angle θ3 is an angle by which the multiple neighboring elastic members 57 come into contact with each other, for example. Note that the external force F2 may be obtained by replacing the coil springs 82 (see FIG. 3), for example.

Figure 10:
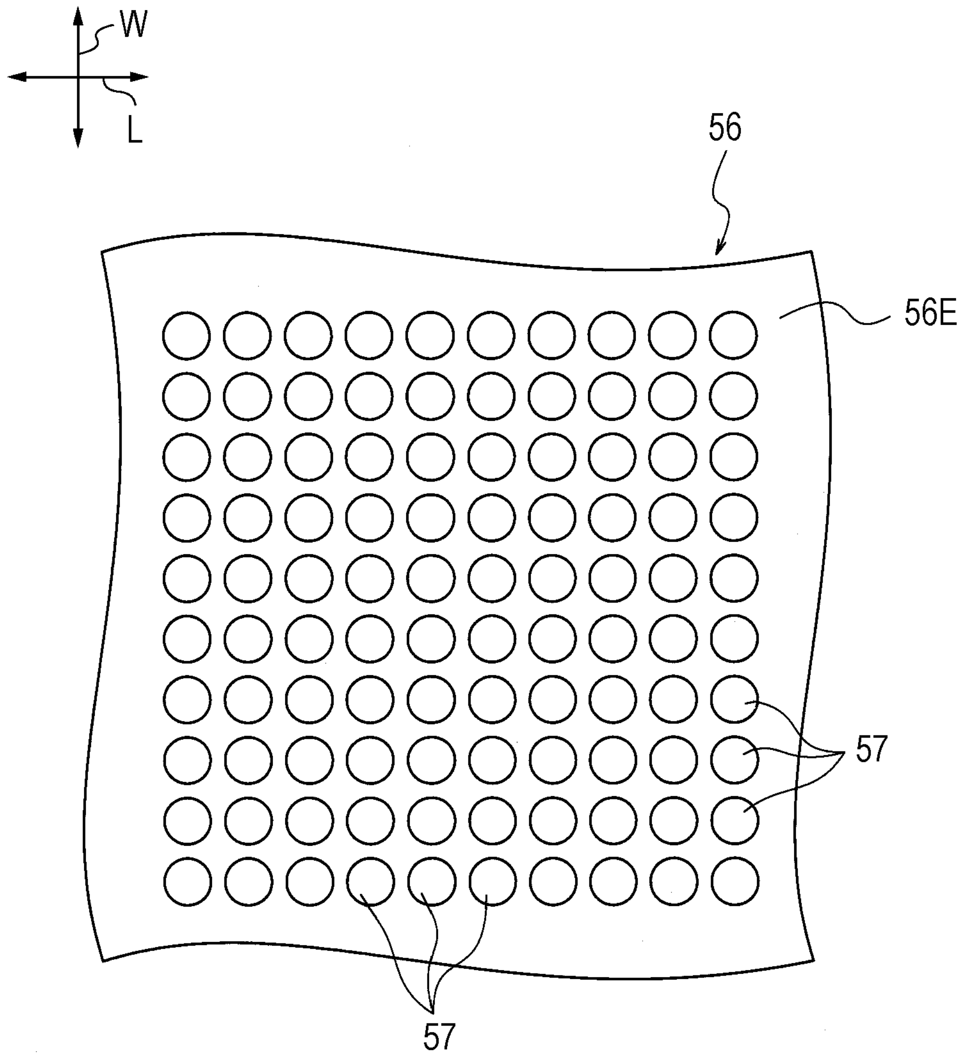
FIG. 10 is a bottom view illustrating an alignment of elastic members.

As illustrated in FIG. 10, in the lower face 56E of the power source contact 56, the multiple elastic members 57 are arranged in a matrix spaced away from each other in the L direction and the W direction. The interval in the L direction and the W direction between the multiple elastic members 57 is 0.2 mm, for example. Further, the power source contact 56 includes 270 elastic members 57 (270 pins), for example. The number of pins per unit area is here defined as a packing density. The packing density of the multiple elastic members 57 is higher than the packing density of the multiple signal contacts 54 (see FIG. 7), and is, for example, three times higher than the packing density of the multiple signal contacts 54. Further, the packing density of the multiple elastic members 57 is set such that the multiple elastic members 57 may overlap and come into contact with each other when the external force F2 (see FIG. 13) is applied to the power source contacts 56.

Note that the density, the elasticity, and the number of the elastic members 57 are set based on the pressing force and the stroke in the H direction of the signal contacts 54, the power source contacts 56 and 58 (see FIG. 8), and the ground contacts 62 and 64 (see FIG. 9). Specifically, the pressing force and the stroke in the H direction of the power source contacts 56 and 58 and the ground contacts 62 and 64 are set so as to be close to the pressing force and the stroke in the H direction of the entire multiple signal contacts 54. The stroke of the signal contacts 54, the power source contacts 56 and 58, and the ground contacts 62 and 64 is 0.3 mm, for example.

As an example of a setting of the multiple elastic members 57, when the stroke of the signal contacts 54 is 0.3 mm, the weight applied to one signal contact 54 is assumed to be 20 g. Since the number of the signal contacts 54 is 80, for example, the weight on the entire signal contacts 54 is 20×80=1600 (g).

On the other hand, when the stroke of the power source contacts 56 and 58 is 0.3 mm, the weight applied to one elastic member 57 is assumed to be 6 g. Since the number of the elastic members 57 is 270, for example, the weight on the entire power source contact 56 is 270×6=1620 (g), so that substantially the same weight as that on the signal contacts 54 may be obtained.

Assembly of Printed Board Unit

As illustrated in FIG. 3, the positioning pins 74B of the stiffener 74 are inserted upward in the H direction into the positioning holes 44B of the system board 34, the positioning holes 52E of the interposer 50, and the positioning holes 76C of the spacer 76 in this order. This allows the system board 34, the interposer 50, and the spacer 76 to be positioned with respect to the stiffener 74. At this time, as illustrated in FIG. 4, the signal contact 54 and the first pad 46 come into contact with each other, the power source contact 58 and the second pad 48A come into contact with each other, and the ground contact 64 and the second pad 48B come into contact with each other.

Next, as illustrated in FIG. 3, the package 32 is arranged inside the opening 76A of the spacer 76 and on the interposer 50. The spacer 76 is arranged surrounding the package 32. At this time, as illustrated in FIG. 4, the signal contact 54 and the first pad 38 come into contact with each other, the power source contact 58 and the second pad 42A come into contact with each other, and the ground contact 62 and the second pad 42B come into contact with each other.

Next, as illustrated in FIG. 3, the positioning pins 74B are inserted in the positioning holes 72C of the heat sink 72. This allows also the heat sink 72 to be positioned with respect to the stiffener 74. Note that the heat sink 72 may be fixed in advance to the upper face 36B (the opposite side to the interposer 50) of the package 32.

Next, the screws 78 are inserted in the coil springs 82, and the screws 78 are inserted in the holes 72B, the holes 76B, the fourth through holes 52D, and the through holes 44A in this order. The external threads of the screws 78 are then fastened to the fastening holes 74C of the stiffener 74. Thus, the printed board unit 30 is complete. The spacer 76 is held between the interposer 50 and the heat sink 72.

Effect and Advantage

Next, effects and advantages of the present embodiment will be described.

As illustrated in FIG. 7, in a state where the printed board unit 30 is assembled, when the downward external force F1 is applied along the H direction to the signal contact 54, the signal contact 54 is elastically deformed. Note that the external force F1 is an external force applied by contracting the coil springs 82 (see FIG. 3). Further, a shift distance in the H direction of the signal contact 54 when the external force F1 is applied to the signal contact 54 is represented as Δd1. That is, the upper end of the signal contact 54 shifts downward in the H direction by the shift distance Δd1 with respect to the position given before the application of the external force F1. Then, an upward pressing force F3 is applied along the H direction to the first pad 38. At this time, the stroke of the signal contact 54 is d1.

As illustrated in FIG. 11, when the downward external force F1 along the H direction is applied to the package substrate 36 after the printed board unit 30 is assembled, the multiple elastic members 57 are elastically deformed. This causes the power source contact 56 to shift downward in the H direction by a shift distance Δd2 with respect to the position given before the application of the external force F1. Then, an upward pressing force F4 along the H direction is applied to the second pad 42A. At this time, the ground contact 62 (see FIG. 4) shifts by the shift distance Δd2 in a similar manner, and the pressing force F4 is applied to the second pad 42B (see FIG. 4). Further, at this time, the stroke of the power source contacts 56 and 58 and the ground contacts 62 and 64 (see FIG. 4) is d2.

Here, as a comparative example to the present embodiment, a printed board unit that includes signal pins and power source pins having a higher elasticity than the signal pins will be described. In the printed board unit of the comparative example, since the number of the power source pins, which have a higher elasticity than the signal pins, is greater than the number of the signal pins, the pressing force and the stroke of the power source pins may be larger than the pressing force and the stroke of the signal pins. Thus, in the printed board unit of the comparative example, the contact state between the signal pins and the fixing pads is different from the contact state between the power source pins and the fixing pads, which may result in an unstable contact state of those pins and fixing pads (may result in lower followability of the signal pins).

On the other hand, in the printed board unit 30 illustrated in FIG. 4, the density, the elasticity, and the number of the multiple elastic members 57 and 63 are set as described above. That is, the density, the elasticity, and the number of the multiple elastic members 57 are set so that the power source contacts 56 and 58, the ground contacts 62 and 64, and the multiple signal contacts 54 have close values of the pressing force and the stroke in the H direction. Thus, the stroke d2 of the power source contacts 56 and 58 and the ground contacts 62 and 64 is a value close to the stroke d1 of the signal contact 54 (see FIG. 7). Further, the pressing force F4 is a value close to the pressing force F3 (see FIG. 7). This enables the stabilization of the contact state between the signal contact 54 and the first pads 38 and 46, the contact state between the power source contact 56 and the second pads 42A and 48A, and the contact state between the ground contact 62 and the second pads 42B and 48B in the printed board unit 30.

Further, in the printed board unit 30, a pair of the power source contacts 56 and 58 and a pair of the ground contacts 62 and 64 each have a larger sectional area than the signal contact 54. Moreover, each of the power source contacts 56 and 58 and the ground contacts 62 and 64 is a metallic block, so that the contact 56, 58, 62, or 64 may contact with the second pad 42A, 48A, 42B, or 48B at a larger contact area than in the case of the multiple signal contacts 54 arranged with spacing. In addition, in the printed board unit 30, the multiple elastic members 57 and 63 are provided. Accordingly, in the printed board unit 30, the current fed to the power source contact 56 and the ground contact 62 may be increased compared to the current fed to the signal contacts 54. That is, in the printed board unit 30, the absolute value of the maximum tolerance current value may be increased.

Moreover, in the printed board unit 30, the multiple elastic members 57 are provided to one power source contact 56 and thus have the same potential. Further, the multiple elastic members 63 are provided to one ground contact 62 and thus have the same potential. Accordingly, even when the multiple elastic members 57 come into contact with each other or the multiple elastic members 63 come into contact with each other, no short circuit occurs. Therefore, the interval (pitch) between the multiple elastic members 57 and between the multiple elastic members 63 may be set without restriction, which enables a higher packing density of the multiple elastic members 57 and the multiple elastic members 63 than the packing density of the signal contacts 54.

In addition, in the printed board unit 30, since copper is used for the power source contacts 56 and 58 and the ground contacts 62 and 64, for example, a higher heat radiation effect (cooling effect) is obtained than in the case where other metals are used. Thus, in the printed board unit 30, a rise in temperature of the power source contacts 56 and 58 and the ground contacts 62 and 64 is suppressed, so that an increase in resistance and contact resistance of the conductor due to a rise in temperature may be suppressed. Further, a reduction in the current fed to the power source contacts 56 and 58 and the ground contacts 62 and 64 may be suppressed.

When, as a comparative example, the power source contacts 56 and 58 and the ground contacts 62 and 64 were made of the same material as that used in the signal contacts 54, a rise in temperature when the current flows is around 30 degrees centigrade and the tolerance current value may be around 70% the maximum tolerance current value, for example.

On the other hand, in the present embodiment, when the same current as in the comparative example is fed, since the rise in temperature of the power source contacts 56 and 58 and the ground contacts 62 and 64 is suppressed to around 10 degrees centigrade, the tolerance current value is around 90% the maximum tolerance current value. That is, the present embodiment is less likely to cause a rise in temperature and thus allows a larger tolerance current value than in the comparative example.

As illustrated in FIG. 11, in the power source contacts 56 and 58, the protruding parts 56B and 58B protruding from the terminal bodies 56A and 58A contact with the second pads 42A and 48A, respectively. Therefore, the terminal bodies 56A and 58A do not have to entirely contact with the second pads 42A and 48A, and the contact area may be changed by changing the shape of the protruding parts 56B and 58B. This allows, in the printed board unit 30, the contact area between the power source contacts 56 and 58 and the second pads 42A and 48A to be wider than the contact area between the signal contact 54 (see FIG. 7) and the first pads 38 and 46 (see FIG. 7). Note that the same applies to the ground contacts 62 and 64 (see FIG. 9).

Further, the protruding parts 56B and 58B each include a cross section curved in a convex manner. Thus, somewhere on the curved surfaces of the protruding parts 56B and 58B may contact with the second pads 42A and 48A, respectively, even when the power source contacts 56 and 58 may incline on the way of shifting, so that the contact areas between the power source contacts 56 and 58 and the second pads 42A and 48A may be ensured. That is, the followability of the power source contacts 56 and 58 to the second pads 42A and 48A increases.

Moreover, the protruding parts 56B and 58B are arranged in the centers of the terminal bodies 56A and 58A, respectively. Therefore, the point of action of the external force F1 is closer to the centers in the W direction of the terminal bodies 56A and 58A than in the case where the protruding parts 56B and 58B are formed at the ends of the terminal bodies 56A and 58A. This may make the gap d4 between the power source contact 56 and the power source contact 58 less likely to vary between one end of the contacts 56 and 58 and the other end of the contacts 56 and 58 in the W direction.

As illustrated in FIG. 8, a shift in the H direction of the power source contacts 56 and 58 is restricted by the step parts 56C and 58C coming into contact with the flange part 53A, so that the power source contacts 56 and 58 are less likely to be detached from the first through opening 52A to the outside. As illustrated in FIG. 9, a shift in the H direction of the ground contacts 62 and 64 is restricted by the step parts 56C and 58C coming into contact with the flange part 53B, so that the ground contacts 62 and 64 are less likely to be detached from the second through opening 52B to the outside.

As illustrated in FIG. 8 and FIG. 9, each of the step parts 56C and 58C includes the L-shaped cross section. Further, each of the flange parts 53A and 53B includes the inverse L-shaped cross section. Thus, the step part 56C and the flange part 53A contact with each other so as to be engaged to each other, and the step part 58C and the flange part 53B contact with each other so as to be engaged to each other. This makes it possible to narrow the gaps between the flange part 53A and the step part 56C and between the flange part 53B and the step part 58C.

As illustrated in FIG. 8 and FIG. 9, the multiple elastic members 57 are formed on the power source contact 56 and contact with the power source contact 58. Further, the multiple elastic members 63 are formed on the ground contact 62 and contact with the ground contact 64. In such a way, the elastic members 57 are integrated with the power source contact 56, and the elastic members 63 are integrated with the ground contact 64, so that the number of parts may be reduced, which facilitates an assembly of the printed board unit 30.

Moreover, in a state before the external force F1 (see FIG. 11) is applied to the power source contact 56 and the ground contact 62 from the second pads 42A and 48A, the multiple elastic members 57 and 63 contact slantwise with the upper face 58E and have the same inclination with each other. When the external force F1 is applied to the power source contact 56 and the ground contact 62, the elastic members 57 and 63 are deformed in the same direction, which may result in stabilization of the shifting direction of the power source contact 56 and the ground contact 62.

As illustrated in FIG. 13, the multiple elastic members 57 overlap and come into contact with each other when the external force F2 is applied to the power source contact 56. Thus, the multiple elastic members 57 contacted make a block to form one electro-conductive material, which allows a large current to flow in the multiple elastic members 57. Moreover, since the multiple elastic members 57 that make a block to form one electro-conductive material may have a larger volume and larger heat capacity than a single individual elastic member 57, the temperature is less likely to rise even when a large current flows. Therefore, the heat resistance of the multiple elastic members 57 may be increased.

Further, as illustrated in FIG. 13, the multiple elastic members 57 overlap and contact with each other, so that the gap d5 may be reduced. Accordingly, the power source contact 56, the ground contact 62, and the signal contact 54 are electrically connected to each other with a lower height in the H direction of the interposer 50 when the external force is applied, which enables a shorter conducting path of the signal contact 54 and a faster signal transmission.

As illustrated in FIG. 10, the packing density of the multiple elastic members 57 is higher than the packing density of the multiple signal contacts 54 (see FIG. 7). This enables a reduction in the size of interposer 50 illustrated in FIG. 4 and, even when the sectional area of the elastic member 57 is reduced, the pressing force of the power source contact 56 and the ground contact 62 may be ensured by increasing the packing density of the multiple elastic members 57.

As illustrated in FIG. 4, the spacer 76 is arranged surrounding the package 32 and held between the heat sink 72 and the interposer 50. Accordingly, the gap between the heat sink 72 and the interposer 50 is maintained by the spacer 76, which may suppress inclination of the package substrate 36 and the heat sink 72 when the heat sink 72 is mounted to the package substrate 36.

As described above, the use of the interposer 50 allows a large current to flow, so that a large current may flow from the power source unit 26 (see FIG. 2) to the package 32 in the printed board units 30 and the server 20 (see FIG. 1).

Next, modified examples of the present embodiment will be described.

In the above embodiment, the server 20 has been described as an example of the information processing apparatus. However, the information processing apparatus is not limited to the server 20, but may be a large-sized computer, for example.

The server 20 is not limited to the server having eight printed board units 30, but may be a server having one printed board unit 30 or may be a server having two or more (except eight), that is, multiple printed board units 30. Further, the server 20 may include two or more power source units 26.

The printed board unit 30 may not include the spacer 76 as long as the inclination of the package 32 is small. Further, the printed board unit 30 is not limited to the printed board unit having the stiffener 74 on the lower side of the system board 34, but may be a printed board unit having another board interposed between the stiffener 74 and the system board 34.

The interposer 50 is not limited to the interposer electrically connecting the system board 34 and the package 32 to each other, but may be an interposer electrically connecting other two circuit boards to each other. That is, the first circuit board is not limited to the package substrate 36, but may be another circuit board. The second circuit board is not limited to the substrate 44, but may be another circuit board.

Further, the interposer 50 is not limited to the interposer having one pair of the power source contacts 56 and 58 and one pair of the ground contacts 62 and 64, but may include any other number of pairs thereof. Moreover, the interposer 50 may be an interposer having the power source contacts 56 and 58 without the ground contacts 62 and 64, when a printed board unit includes another grounding member.

The sizes of the first pad 38 and the first pad 46 do not have to be the same, but may be different. Further, the sizes of the second pad 42A and the second pad 48A do not have to be the same, but may be different. Furthermore, the sizes of the second pad 42B and the second pad 48B do not have to be the same, but may be different.

The power source contact 56 and the power source contact 58 may be configured such that one of the power source contact 56 and the power source contact 58 is fixed to the housing 52 and the other is able to shift. Further, the power source contact 56 and the power source contact 58 may have different size as long as they are able to shift in the H direction along the opening of the housing 52. Furthermore, the shape of the power source contact 56 and the power source contact 58 is not limited to a square in plan view but may be other polygons, a circle, or an ellipse.

The ground contact 62 and the ground contact 64 may be configured such that one of the power source contact 56 and the power source contact 58 is fixed to the housing 52 and the other is able to shift. Further, the ground contact 62 and the ground contact 64 may have different size as long as they are able to shift in the H direction along the opening of the housing 52. Furthermore, the shape of the ground contact 62 and the ground contact 64 is not limited to a square in plan view but may be other polygons, a circle, or an ellipse.

The signal contact 54 has been described as the one whose center in the axial direction is bent, for example, but without limited thereto, may be one in which an elastic member is provided between two pin members. Further, the number of the signal contacts 54 is not limited to 80, but may be other numbers. Furthermore, the interval (pitch) between the multiple signal contacts 54 is not limited to 0.8 mm, but may be other lengths. In addition, the signal contact 54 may have a curved shape or a zigzag shape.

The terminal body 56A and the protruding part 56B, and the terminal body 58A and the protruding part 58B are not limited to be formed integrally, but may be manufactured as separate parts and then integrated.

Each cross section of the protruding parts 56B and 58B may be a semicircle or a trapezoid as long as the contact area is ensured. Note that, when the cross section of the protruding parts 56B and 58B is a trapezoid, the surfaces corresponding to an upper base and a lower base of the trapezoid are preferably a mirror finished surface. Moreover, each position of the protruding parts 56B and 58B is not limited to the center of the power source contacts 56 and 58, but may be the position shifted from the center. In addition, each contact area between the protruding parts 56B and 58B and the second pads 42A, 42B, 48A, and 48B is not limited to 150 times the contact area between the signal contact 54 and the first pad 38 in a contact state, but may be a contact area of other multiplying factors.

When the power source contacts 56 and 58 and the ground contacts 62 and 64 are less likely to incline, each of the flange parts 53A and 53B is not limited to the flanges formed to the entire opening edge of the through opening, but may be formed to a part of the opening edge. Further, the flange parts 53A and 53B may be omitted when the power source contacts 56 and 58 and the ground contacts 62 and 64 are less likely to be detached from the housing 52.

Each cross section of the step parts 56C and 58C is not limited to be the L-shape, but may be other shapes. Further, the step parts 56C and 58C may be omitted. Further, the height of the upper face 52F may not be the same as the height of the upper face 56D.

Each of the elastic members 57 and 63 is not limited to be a pillar-like member, but may be a narrow plate-like member. The plate-like elastic members 57 and 63 may increase the contact area when the multiple elastic members 57 contact with each other or the multiple elastic members 63 contact with each other. Further, the number of the elastic members 57 is not limited to 270 and the number of the elastic members 63 is not limited to 270, but may be other numbers. Furthermore, the interval between the multiple elastic members 57 and 63 is not limited to 0.2 mm, but may be other lengths.

Further, the ratio of the sectional area of the elastic members 57 and 63 to the sectional area of the signal contact 54 is not limited to 1:5, but may be other ratios. Furthermore, the density of the elastic members 57 and 63 is not limited to 70% the density of the signal contact 54, but may be a different ratio of density. In addition, the multiple elastic members 57 and 63 may be elastic members that contact with the upper face 58E in a state of standing straight as long as the elastic members may shift in the same direction when an external force is applied.

The material of the power source contacts 56 and 58 and the ground contacts 62 and 64, and the elastic members 57 and 63 is not limited to copper, but may be gold or other metals.

The attachment member is not limited to the heat sink 72, but may be other plate-like members.

Note that, among multiple modified examples described above, modified examples which may be combined may be appropriately combined to be implemented.

As set forth, while one embodiment of the technique disclosed by the present application has been described, the technique disclosed by the present application is not limited to the above, but may of course be implemented in various modifications other than the above without departing from its spirit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An interposer comprising:

a first contact terminal pressed against a first fixed terminal for signal transmission;

a pair of second contact terminals pressed against second fixed terminals for any one of power supply and grounding, the pair of second contact terminals being disposed with a gap in a pressing direction in which the pair of second contact terminals are pressed against the second fixed terminals, each of the pair of second contact terminals having a larger sectional area than the first contact terminal in a crossing direction that crosses the pressing direction;

a plurality of spring members arranged between the pair of second contact terminals, the plurality of spring members being electro-conductive, having a lower elasticity than the first contact terminal, and pressing the pair of second contact terminals against the second fixed terminals; and a substrate in which a through opening where to accommodate the second contact terminals and the spring members is formed, wherein the substrate includes a restricting part that protrudes to an inner side of the through opening and restricts a shift of the second contact terminals in the pressing direction by being in contact with the second contact terminals, and wherein each of the pair of second contact terminals includes a step part to be in contact with the restricting part in a state before an external force is applied from the second fixed terminals to the pair of second contact terminals.

2. The interposer according to claim 1, wherein the number of the plurality of spring members per unit area is greater than the number of the first contact terminals per unit area.

3. The interposer according to claim 1, wherein each of the pair of second contact terminals includes a terminal body and a protruding part, the terminal body having a sectional area that is larger than a sectional area of the first contact terminal, the protruding part protruding from the terminal body toward the corresponding second fixed terminal.

4. The interposer according to claim 3, wherein the protruding part includes a cross section curved in a convex manner.

5. The interposer according to claim 3, wherein the protruding part is arranged in the center of the terminal body when viewed in the pressing direction.

6. The interposer according to claim 1, wherein the plurality of spring members are inclined and come into contact with each other when an external force that is larger than a set external force is applied to the pair of second contact terminals.

7. The interposer according to claim 1, wherein a plurality of the first contact terminals are provided, and a packing density which is the number of the plurality of spring members per unit area is higher than a packing density of the plurality of first contact terminals.

8. The interposer according to claim 1, wherein the plurality of spring members are formed on one of the pair of second contact terminals and contact with the other of the pair of second contact terminals.

9. The interposer according to claim 8, wherein each of the plurality of spring members is formed in a column shape and contacts slantwise with the other of the pair of second contact terminals.

10. A printed board unit comprising:

a first circuit board;

a second circuit board, wherein each of the first circuit board and the second circuit board includes a first fixed terminal for signal transmission and a second fixed terminal for any one of power supply and grounding; and an interposer including:

a first contact terminal pressed against the first fixed terminals, a pair of second contact terminals pressed against the second fixed terminals, the pair of second contact terminals being disposed with a gap in a pressing direction in which the pair of second contact terminals are pressed against the second fixed terminals, each of the pair of second contact terminals having a larger sectional area than the first contact terminal in a crossing direction that crosses the pressing direction, and a plurality of spring members arranged between the pair of second contact terminals, the plurality of spring members being electro-conductive, having a lower elasticity than the first contact terminal, and pressing the pair of the second contact terminals against the second fixed terminals, and a substrate in which a through opening where to accommodate the second contact terminals and the spring members is formed, wherein the substrate includes a restricting part that protrudes to an inner side of the through opening and restricts a shift of the second contact terminals in the pressing direction by being in contact with the second contact terminals, and wherein each of the pair of second contact terminals includes a step part to be in contact with the restricting part in a state before an external force is applied from the second fixed terminals to the pair of second contact terminals.

11. The printed board unit according to claim 10, wherein the number of the plurality of spring members per unit area is greater than the number of the first contact terminals per unit area.

12. The printed board unit according to claim 10, wherein each of the pair of second contact terminals includes a terminal body and a protruding part, the terminal body having a larger sectional area than a sectional area of the first contact terminal, the protruding part protruding from the terminal body toward the corresponding second fixed terminal.

13. The printed board unit according to claim 12, wherein the protruding part includes a cross section curved in a convex manner.

14. The printed board unit according to claim 12, wherein the protruding part is arranged in the center of the terminal body when viewed in the pressing direction.

15. The printed board unit according to claim 10, wherein each of the plurality of spring members is formed on one of the pair of second contact terminals and contact with the other of the pair of second contact terminals.

16. An information processing apparatus comprising:

a printed board unit including, a first circuit board, a second circuit board, wherein each of the first circuit board and the second circuit board includes a first fixed terminal for signal transmission and a second fixed terminal for any one of power supply and grounding, and an interposer including, a first contact terminal pressed against the first fixed terminals, a pair of second contact terminals pressed against the second fixed terminals, the pair of second contact terminals being disposed with a gap in a pressing direction in which the pair of second contact terminals are pressed against the second fixed terminals, each of the pair of second contact terminals having a larger sectional area than the first contact terminal in a crossing direction that crosses the pressing direction, and a plurality of spring members arranged between the pair of second contact terminals, the plurality of spring members being electro-conductive, having a lower elasticity than the first contact terminal, and pressing the pair of the second contact terminals against the second fixed terminals;

a signal unit adapted to receive input of a signal to be supplied to the first fixed terminal;

a power supply unit adapted to supply power to the second fixed terminals; and a substrate in which a through opening where to accommodate the second contact terminals and the spring members is formed, wherein the substrate includes a restricting part that protrudes to an inner side of the through opening and restricts a shift of the second contact terminals in the pressing direction by being in contact with the second contact terminals, and wherein each of the pair of second contact terminals includes a step part to be in contact with the restricting part in a state before an external force is applied from the second fixed terminals to the pair of second contact terminals.

* * * * *